(12) United States Patent
Shinkai et al.

(10) Patent No.: US 7,119,649 B2
(45) Date of Patent: Oct. 10, 2006

(54) COMMON MODE NOISE FILTER

(75) Inventors: Atsushi Shinkai, Fukui (JP); Hironobu Chiba, Hyogo (JP); Shogo Nakayama, Osaka (JP); Hideki Tanaka, Fukui (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/562,557

(22) PCT Filed: May 24, 2005

(86) PCT No.: PCT/JP2005/009421

§ 371 (c)(1),
(2), (4) Date: Dec. 28, 2005

(87) PCT Pub. No.: WO2005/117037

PCT Pub. Date: Dec. 8, 2005

(65) Prior Publication Data
US 2006/0158301 A1 Jul. 20, 2006

(30) Foreign Application Priority Data
May 28, 2004 (JP) ............................ 2004-159142
May 28, 2004 (JP) ............................ 2004-159143

(51) Int. Cl.
*H01F 5/00* (2006.01)
(52) U.S. Cl. .................................................. 336/200
(58) Field of Classification Search ................ 336/65, 336/83, 200, 206–208, 232–234
See application file for complete search history.

(56) References Cited

U.S. PATENT DOCUMENTS 5,850,682 A * 12/1998 Ushiro ....................... 29/608
6,288,626 B1 * 9/2001 Cameron et al. ........... 336/200
6,384,705 B1 * 5/2002 Huang et al. ............... 336/200

FOREIGN PATENT DOCUMENTS

| JP | 2000-190410 | 7/2000 |
|----|-------------|--------|
| JP | 2001-076930 | 3/2001 |
| JP | 2001-160510 | 6/2001 |
| JP | 2002-190410 | 7/2002 |
| JP | 2004-095860 | 3/2004 |
| JP | 2005-085997 | 3/2005 |
| JP | 2005-150137 | 6/2005 |
| WO | 01/67470    | 9/2001 |

* cited by examiner

*Primary Examiner*—Tuyen T Nguyen
(74) *Attorney, Agent, or Firm*—Wenderoth, Lind & Ponack, L.L.P.

(57) ABSTRACT

A common mode noise filter includes a first insulating layer made of magnetic material, a first conductor on the first insulating layer, a second insulating layer located on the first conductor and made of nonmagnetic material, a second conductor having a spiral shape on the second insulating layer and connected with the first conductor, a third insulating layer located on the second conductor and made of nonmagnetic material, a third conductor having a spiral shape provided on the third insulating layer, a fourth insulating layer located on the third conductor and made of nonmagnetic material, a fourth conductor connected with the third conductor, a fifth insulating layer provided on the fourth conductor and made of magnetic material. The first conductor and the second conductor provide a first coil. The third conductor and the fourth conductor provide a second coil. The third insulating layer is thicker than the second insulating layer and the fourth insulating layer. This filter can increase impedance of the first and second coils against common mode components.

16 Claims, 14 Drawing Sheets

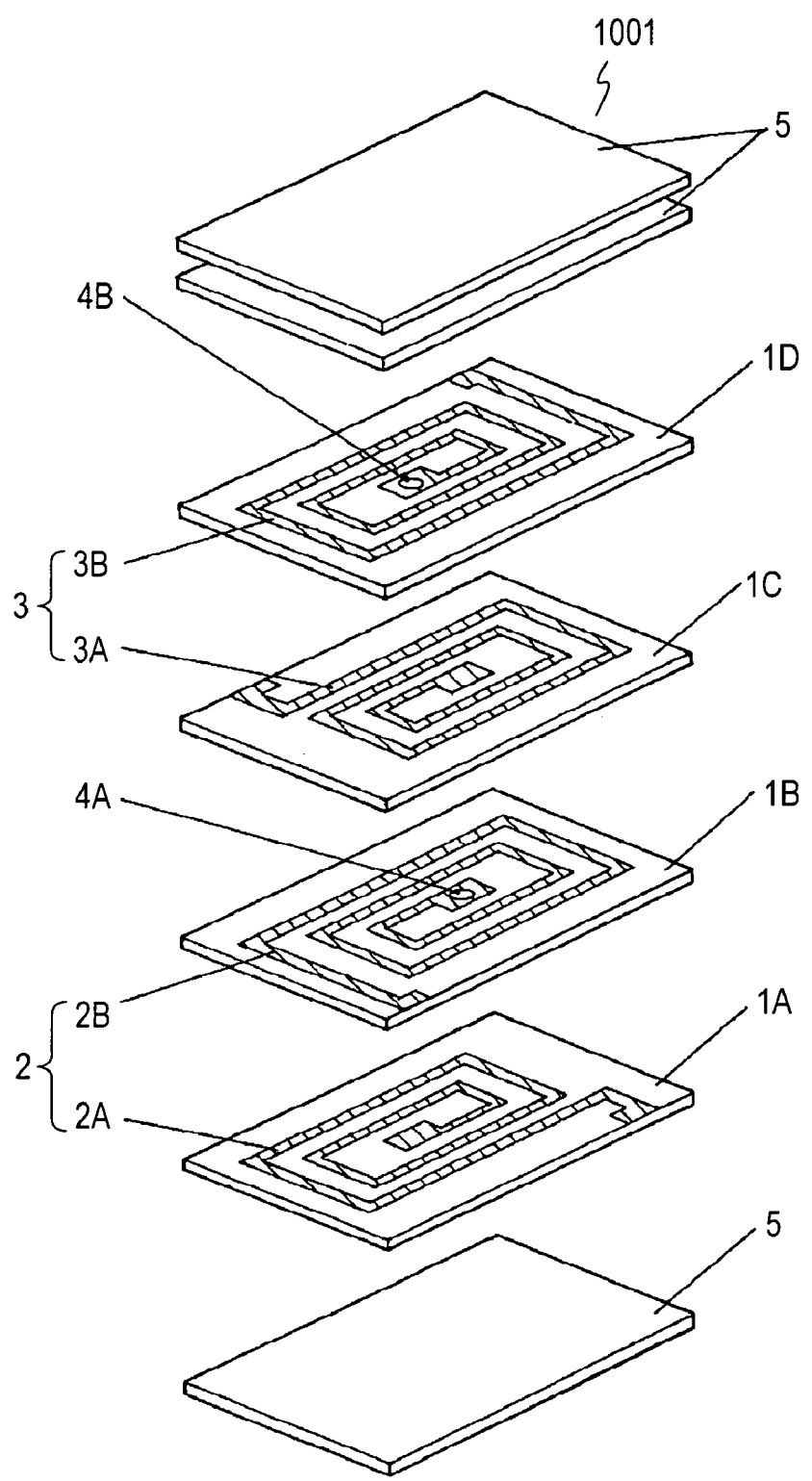
Fig. 16 – PRIOR ART

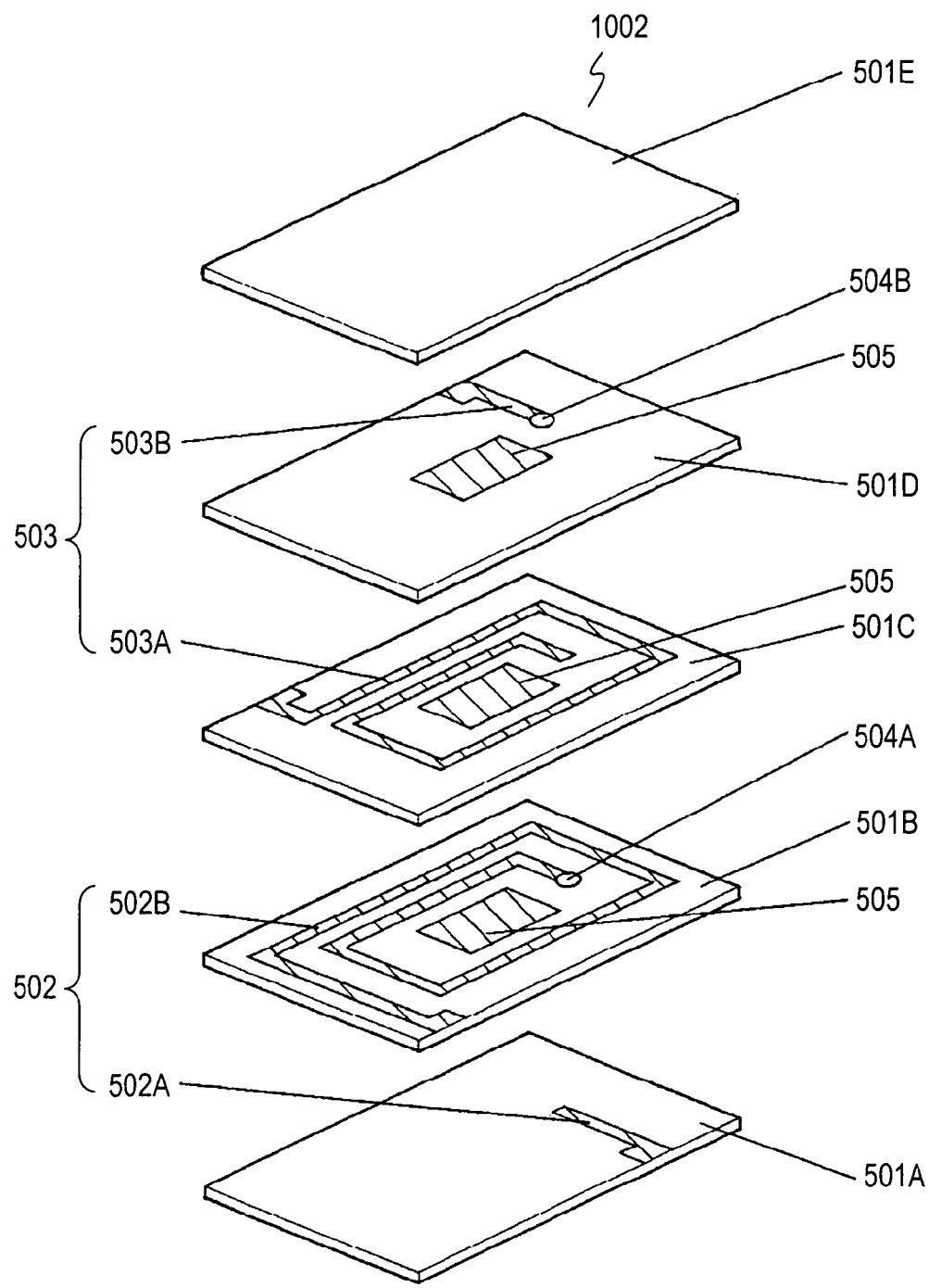
Fig. 17 – PRIOR ART

COMMON MODE NOISE FILTER

TECHNICAL FIELD

The present invention relates to a laminated common mode noise filter having a small size used in various electronic devices.

BACKGROUND OF THE INVENTION

FIG. 16 is an exploded perspective view of conventional common mode noise filter 1001 disclosed in Japanese Patent Laid-Open Publication No. 2000-190410. Conductors 2A, 2B, 3A and 3B having spiral shapes containing metal are provided on top surfaces of insulating layers 1A to 1D, respectively. Conductors 2A and 2B are connected to each other with via-electrode 4A, providing coil 2. Conductors 3A and 3B are connected to each other with via-electrode 4B, providing coil 3. Insulating layers 5 made of magnetic material are provided on a bottom surface of insulating layer 1A and on the top surface of conductor 3B, respectively. Insulating layers 1B to 1D are made of nonmagnetic material. Insulating layers 1A and 5 are made of magnetic material. Conductors 2B and 3A facing each other across insulating layer 1C are magnetically coupled to each other. This arrangement allows coils 2 and 3 to have large impedance for common mode components of signals flowing through these coils, thereby eliminating noises in the common mode components.

In common mode noise filter 1001, if insulating layer 1C is thin, insulating layer 1C may cause insulation failure or metal migration between conductors 2B and 3A, that is, between coils 2 and 3 facing each other across insulating layer 1C. If insulating layers 1B and 1D are thick, the distance between insulating layer 1A and conductor 2B, and the distance between insulating and conductor 3A and layers 5 provided on a top surface of conductor 3A are too long to efficiently utilize magnetic fields generated in insulating layer 1A and insulating layers 5. This arrangement may cause coils 2 and 3 not to have large impedance against the common mode components.

FIG. 17 is an exploded perspective view of conventional common mode noise filter 1002 disclosed in Japanese Patent Laid-Open Publication No. 2001-76930. Conductors 502A, 502B, 503A, and 503B are provided on top surfaces of insulating layers 501A to 501D, respectively. Conductor 502A and conductor 502B having spiral shapes are connected to each other with via-electrode 504A, providing coil 502. Conductors 503A and 503B are connected to each other with via-electrode 504B, providing coil 503. Insulating layer 501E made of magnetic material is formed on a top surface of conductor 503B. Magnetic portions 505 are formed on insulating layers 501B to 501D made of nonmagnetic material and inside the spiral shapes of conductors 502B and 503A.

Coils 502 and 503 have large impedance against common mode components of signals flowing through these coils, thereby eliminating common mode noises. Magnetic portions 505 increase magnetic field between coils 502 and 503, and increase the impedance of coils 502 and 503 against the common mode components, thereby further eliminating common mode noises.

Conventional common mode noise filter 1002 includes magnetic portions 505 respective ones of which are provided on insulating layers 501B to 501D made of nonmagnetic material. Magnetic portions 505 are provided by forming holes in insulating layers 501B to 501D, filling the holes with magnetic material paste, and hardening the paste thermally. In order to increase the sizes of magnetic portions 505, the holes for forming magnetic portions 505 need to have large diameters. The increasing of the diameters of the holes causes the amount of the magnetic material paste to be larger than the volumes of the holes since the paste are easily influenced by surface tension. This may produce spaces around magnetic portions 505, and hence, reduce the magnetic field between coils 502 and 503, thus preventing coils 502 and 503 from having large impedance against the common mode components.

SUMMARY OF THE INVENTION

A common mode noise filter includes a first insulating layer made of magnetic material, a first conductor on the first insulating layer, a second insulating layer located on the first conductor and made of nonmagnetic material, a second conductor having a spiral shape on the second insulating layer and connected with the first conductor, a third insulating layer located on the second conductor and made of nonmagnetic material, a third conductor having a spiral shape provided on the third insulating layer, a fourth insulating layer located on the third conductor and made of nonmagnetic material, a fourth conductor connected with the third conductor, a fifth insulating layer provided on the fourth conductor and made of magnetic material. The first and second conductors provide a first coil. The third and fourth conductors provide a second coil. The third insulating layer is thicker than the second insulating layer and the fourth insulating layer.

This filter can increase impedance of the first and second coils against common mode components.

BRIEF DESCRIPTION OF THE DRAWINGS

FIG. 16 is an exploded perspective view of a conventional common mode noise filter.

FIG. 17 is an exploded perspective view of another conventional common mode noise filter.

REFERENCE NUMERALS

11 Insulating Layer (First Insulating Layer)
12 Conductor (First Conductor)
13 Insulating Layer (Second Insulating Layer)
14 Conductor (Second Conductor)
15 Insulating Layer (Third Insulating Layer)
16 Conductor (Third Conductor)
17 Insulating Layer (Fourth Insulating Layer)
18 Conductor (Fourth Conductor)
19 Insulating Layer (Fifth Insulating Layer)
20 Coil (First Coil)
21 Coil (Second Coil)
22 Lead Electrode (First Lead Electrode)
24 Lead Electrode (Second Lead Electrode)
25 Lead Electrode (Third Lead Electrode)
27 Lead Electrode (Fourth Lead Electrode)
34 Magnetic Portion
118 Conductor (Fourth Conductor)
511 Insulating Layer (First Insulating Layer)
512 Conductor (First Conductor)
513 Insulating Layer (Second Insulating Layer)
514 Conductor (Second Conductor)
515 Insulating Layer (Third Insulating Layer)
516 Conductor (Third Conductor)
517 Insulating Layer (Fourth Insulating Layer)
518 Conductor (Fourth Conductor)
519 Insulating Layer (Fifth Insulating Layer)
520 Coil (First Coil)
521 Coil (Second Coil)
522 Magnetic Portion
523 Lead Electrode (First Lead Electrode)
525 Lead Electrode (Second Lead Electrode)
526 Lead Electrode (Third Lead Electrode)
528 Lead Electrode (Fourth Lead Electrode)
5518 Conductor (Fourth Conductor)

DETAILED DESCRIPTION OF THE PREFERRED EMBODIMENTS

Exemplary Embodiment 1

Figure 1:
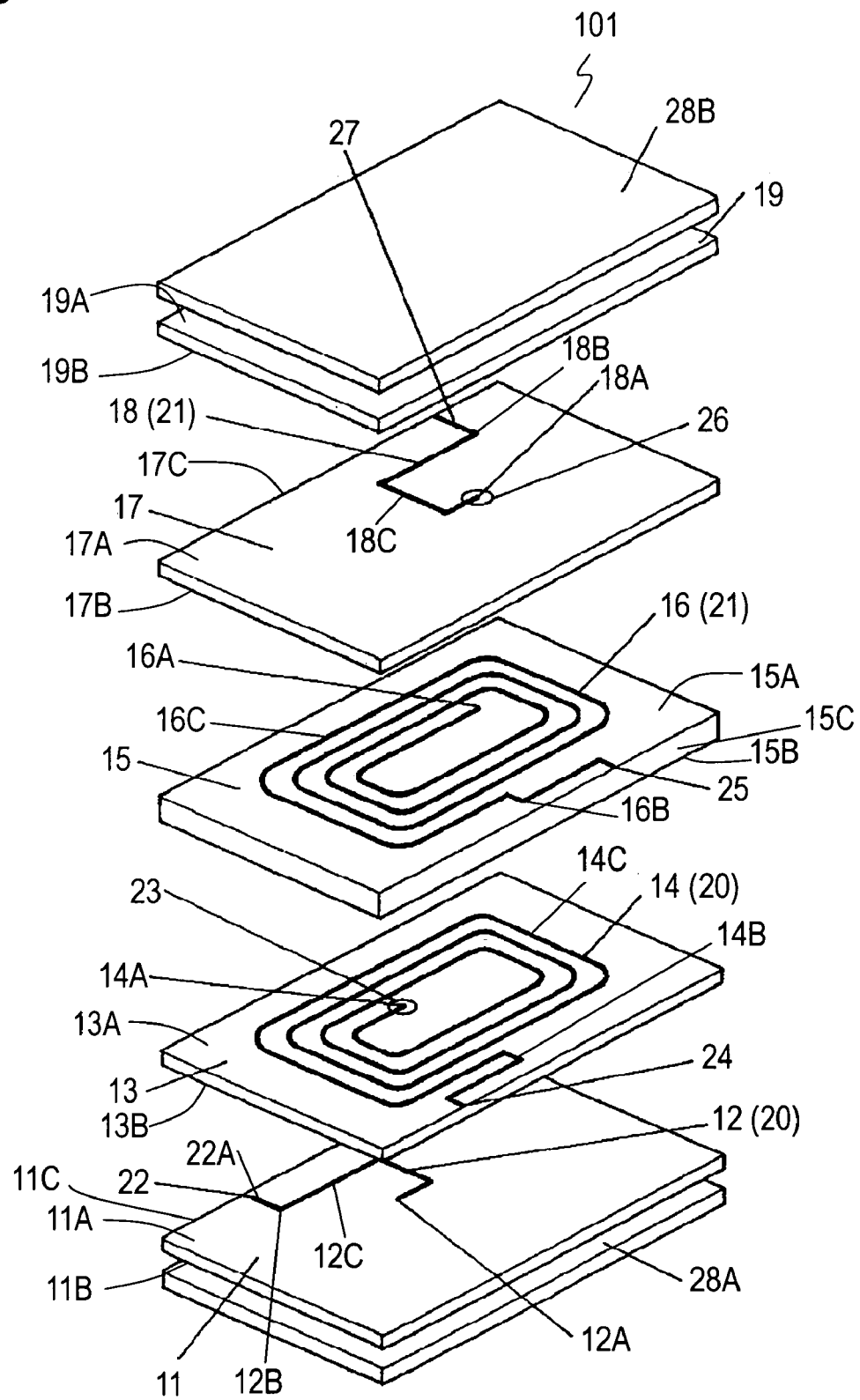
FIG. 1 is an exploded perspective view of a common mode noise filter according to Exemplary Embodiment 1 of the present invention.

FIG. 1 is an exploded perspective view of common mode noise filter 101 according to Exemplary Embodiment 1 of the present invention. Common mode noise filter 101 includes conductor 12 provided on top surface 11A of insulating layer 11, insulating layer 13 provided on top surface 12C of conductor 12, conductor 14 having a spiral shape provided on top surface 13A of insulating layer 13, insulating layer 15 provided on top surface 14C of conductor 14, conductor 16 having a spiral shape provided on top surface 15A of insulating layer 15, insulating layer 17 provided on top surface 16C of conductor 16, conductor 18 provided on top surface 17A of insulating layer 17, and insulating layer 19 provided on top surface 18C of conductor 18. Thus, bottom surface 13B of insulating layer 13 is located on top surface 12C of conductor 12. Bottom surface 15B of insulating layer 15 is located on top surface 14C of conductor 14. Bottom surface 17B of insulating layer 17 is located on top surface 16C of conductor 16. Bottom surface 19B of insulating layer 19 is located on top surface 18C of conductor 18.

Insulating layers 11 and 19 are made of magnetic material, and insulating layers 13, 15, and 17 are made of nonmagnetic material. Insulating layer 15 is thicker than insulating layers 13 and 17. Insulating layer 11 is made of magnetic material, such as $Fe_2O_3$-based ferrite, and has a sheet shape, having an insulation property.

Conductor 12 is formed on top surface 11A of insulating layer 11 by plating conductive material, such as silver. One end 12B of conductor 12 is connected with lead electrode 22 exposing to side 11C of insulating layer 11.

Insulating layer 13 is made of nonmagnetic material, such as Cu—Zn ferrite or glass ceramics, and has a sheet shape, having an insulation property. Via-electrode 23 is provided at the center of insulating layer 13 and penetrates from top surface 13A to bottom surface 13B of layer 13. Via-electrode 23 is connected with other end 12A of conductor 12.

Conductor 14 has a spiral shape on top surface 13A of insulating layer 13 and is formed by plating conductive material, such as silver. One end 14B of conductor 14 is connected with lead electrode 24 exposing to side 13C of insulating layer 13. Other end 14A of conductor 14 is located inside the spiral shape and connected with via-electrode 23. Via-electrode 23 electrically connects other end 12A of conductor 12 with other end 14A of conductor 14, thus allowing conductors 12 and 14 to provide coil 20.

Insulating layer 15 is made of nonmagnetic material, such as Cu—Zn ferrite or glass ceramics, and has a sheet shape, having an insulation property. Insulating layer 15 is thicker than insulating layers 13 and 17.

Conductor 16 has a spiral shape on top surface 15A of insulating layer 15 and is formed by plating conductive material, such as silver. One end 16B of conductor 16 is connected with lead electrode 25 exposing to side 15C of insulating layer 15.

Insulating layer 17 is made of nonmagnetic material, such as Cu—Zn ferrite or glass ceramics, and has a sheet shape, having an insulation property. Via-electrode 26 is provided at the center of insulating layer 17, and penetrates from top surface 17A to bottom surface 17B of layer 17. Via-electrode 26 is connected with other end 16A of conductor 16. End 16A is located inside the spiral shape of conductor 16.

Conductor 18 is formed on top surface 17A of insulating layer 17 by plating conductive material, such as silver. One end 18B of conductor 18 is connected with lead electrode 27 exposing to side 17C of insulating layer 17. Other end 18A of conductor 18 is connected with via-electrode 26. Via-electrode 26 electrically connects other end 16A of conductor 16 with other end 18A of conductor 18, thus allowing conductors 16 and 18 to provide coil 21.

Since most of Conductor 16 faces conductor 14 across insulating layer 15, conductor 16 magnetically affects conductor 14, hence causing coil 20 to be magnetically coupled to coil 21. This coupling allows coils 20 and 21 to have large impedance against common mode components of currents (signals) flowing through these coils. Conductors 14 and 16 having the spiral shapes increase the impedance of coils 20 and 21. Via-electrodes 23 and 26 are formed by putting a conductive material, such as silver, into the holes penetrating insulating layers 13 and 17, respectively.

Insulating layer 19 is made of magnetic material, such as $Fe_2O_3$-based ferrite, and has a sheet shape, having an insulation property.

Insulating layers 13, 15 and 17 made of nonmagnetic material may be made of ferrite-based nonmagnetic material. This enables insulating layers 13, 15, and 17 to be sintered together with insulating layers 11 and 19 made of ferrite-based magnetic material, thereby allowing all the insulating layers to be bonded securely and stabilizing filter 101.

Dummy insulating layers 28A and 28B having sheet shapes are provided on bottom surface 11B of insulating layer 11 and on top surface 19A of insulating layer 19, respectively. Dummy insulating layers 28A and 28B have insulation properties and may be made of either magnetic material or nonmagnetic material. The number of insulating layers 11, 13, 15, 17 and 19 and the number of dummy insulating layers 28A and 28B are not limited to that shown in FIG. 1.

Figure 2:
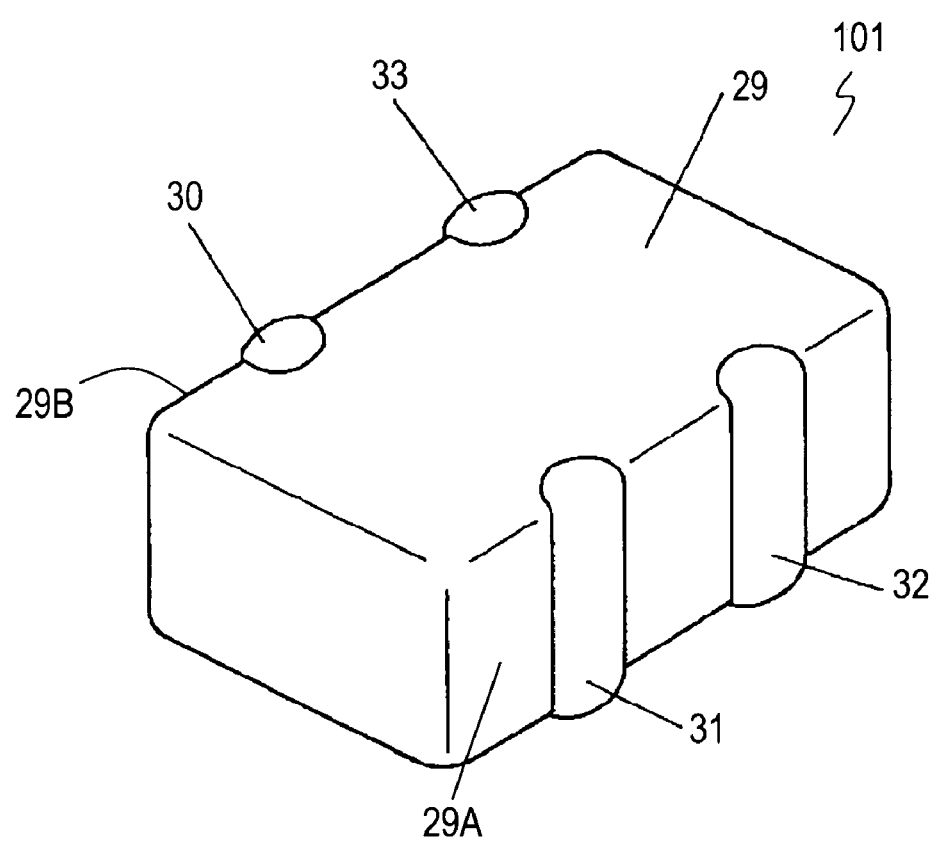
FIG. 2 is a perspective view of the common mode noise filter according to Embodiment 1.

FIG. 2 is a perspective view of common mode noise filter 101. The aforementioned insulating layers, dummy insulating layers, conductors, lead electrodes, and via-electrodes provide noise filter body 29. External electrodes 31 and 32 are provided on side 29A of noise filer body 29, and external electrodes 30 and 33 are provided on side 29B of body 29. External electrodes 30, 31, 32, and 33 are connected with lead electrodes 22, 24, 25, and 27, respectively.

As mentioned above, conductors 14 and 16 magnetically affecting each other have the spiral shapes, thus having respective long portions magnetically affecting each other. Conductors 12, 14, 16, and 18 providing coils 20 and 21 and generating magnetic fields are provided on insulating layers 13, 15, and 17 made of nonmagnetic material, hence reducing leakage of magnetic flux. This effect increases a magnetic coupling between coils 20 and 21 and allows the magnetic field penetrating insulating layers 11 and 19 made of magnetic material to be used efficiently, thereby increasing the impedance against the common mode components of the currents flowing through coils 20 and 21.

The shapes of conductors 12 and 18 are not limited as long as the shapes do not reduce the impedance against the common mode components. As shown in FIG. 1, conductors 12 and 18 have straight shapes, not spiral shapes like conductors 14 and 16. Therefore, the filter has small impedance against differential components, and has the large impedance against the common mode components accordingly.

Lead electrodes 22, 24, 25, and 27 may be preferably made of conductive material, such as silver, identical to that of conductors 12, 14, 16, and 18, thereby being formed simultaneously to conductors 12, 14, 16, and 18. Conductors 12, 14, 16, and 18 and lead electrodes 22, 24, 25, and 27 may be formed by a method, such as printing or vapor deposition, other than the plating.

Figure 3:
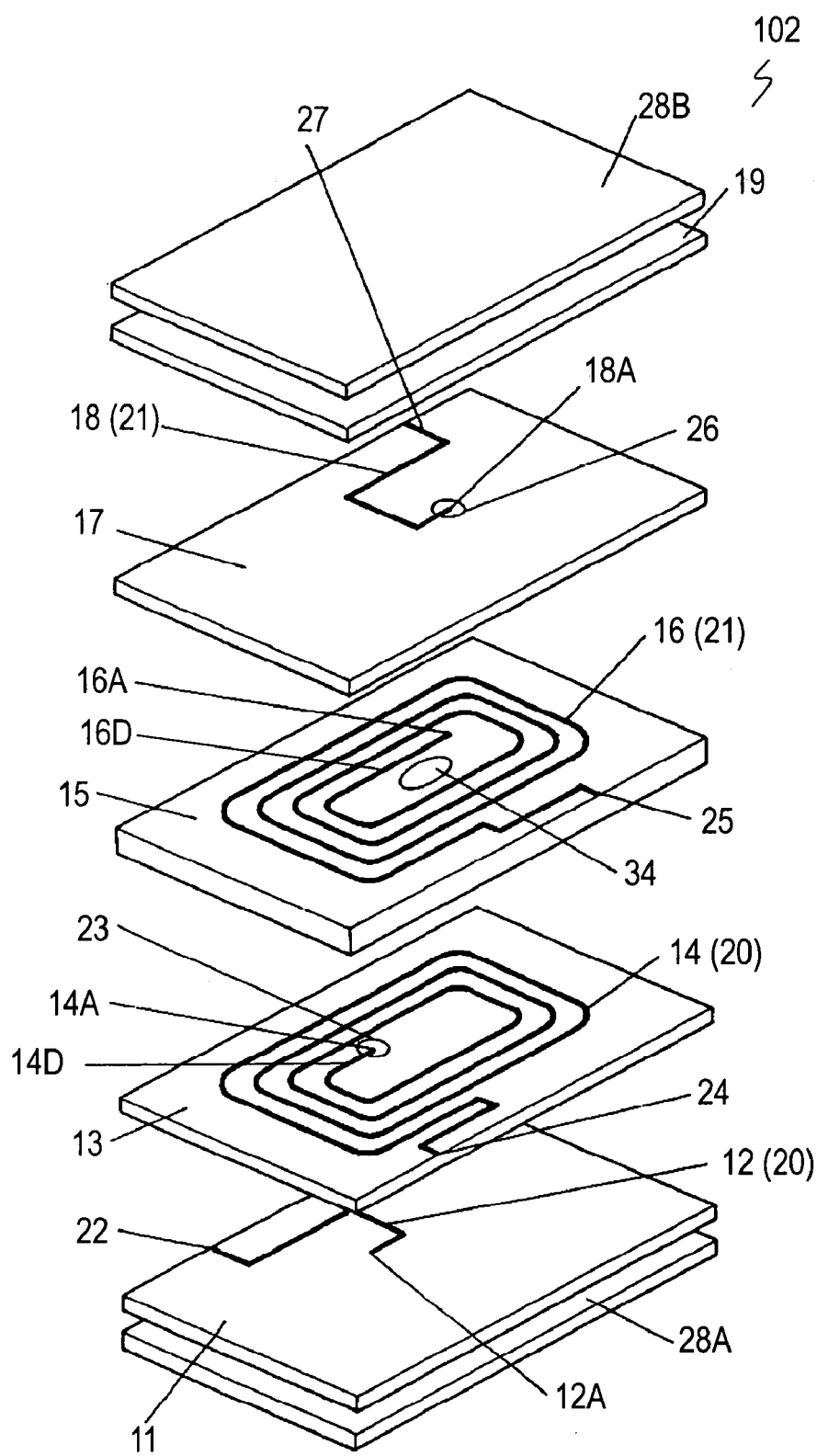
FIG. 3 is an exploded perspective view of another common mode noise filter according to Embodiment 1.

FIG. 3 is an exploded perspective view of another common mode noise filter 102 according to Embodiment 1. Filter 102 includes magnetic portion 34 made of magnetic material formed on insulating layer 15 and inside the spiral shapes of conductors 14 and 16. Magnetic portion 34 is located inside innermost portions 14D and 16D of conductors 14 and 16 having the spiral shapes, and contacts none of conductor 14 and 16. Magnetic portion 34 increases the magnetic field between conductors 14 and 16, that is, between coils 20 and 21 magnetically coupled to each other, thereby increasing the impedance of coils 20 and 21 against the common mode components. If insulating layer 15 is thick, the distance between coils 20 and 21 is long, so that magnetic portion 34 capable of increasing the magnetic field between coils 20 and 21 effectively increases the magnetic coupling between coils 20 and 21. Magnetic portion 34 and via-electrodes 23 and 26 which are made of different materials from each other are provided not on the same insulating layer, hence being formed easily. Magnetic portion 34 may be replaced by plural magnetic portions each of which is located in the same position as magnetic portion 34 and has the same structure as magnetic portion 34.

Figure 4:
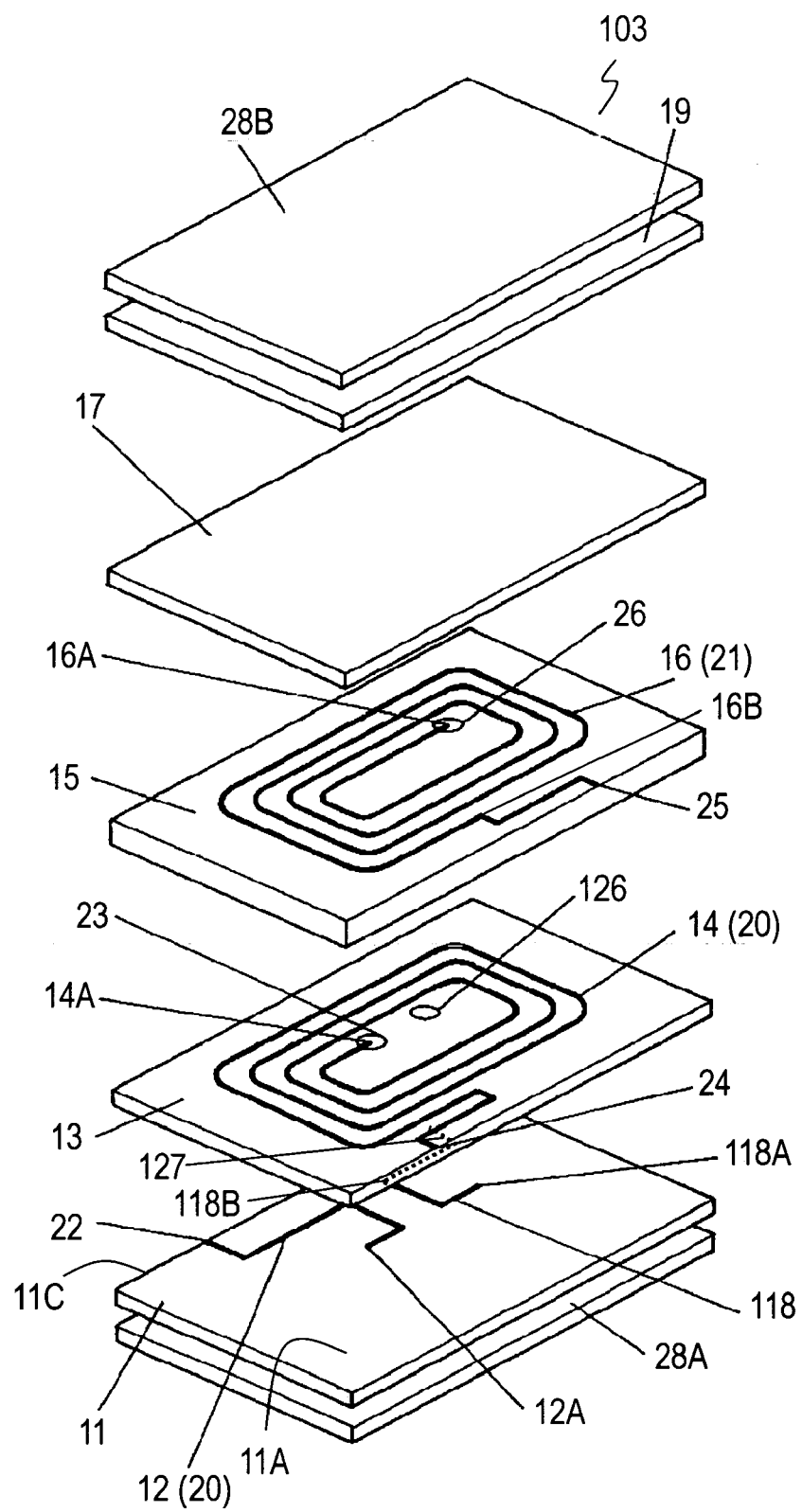
FIG. 4 is an exploded perspective view of a further common mode noise filter according to Embodiment 1.

FIG. 4 is an exploded perspective view of a further common mode noise filter 103 according to Embodiment 1. Via-electrode 126 is provided in insulating layer 15 at a position corresponding to via-electrode 26 provided in insulating layer 13, and is connected with via-electrode 26. Instead of conductor 18 shown in FIG. 1, conductor 118 having end 118A connected with via-electrode 126 is provided on top surface 11A of insulating layer 11. Conductor 118 has end 118B connected with lead electrode 127. Lead electrode 127 exposes to side 11C of insulating layer 11 to which lead electrode 22 exposes. Lead electrodes 22 and 127 are located on the same surface, top surface 11A of insulating layer 11, and hence, may be magnetically coupled to each other. This arrangement increases the magnetic coupling between coils 20 and 21, increasing the impedance of the coils against the common mode components.

Lead electrodes 22, 24, 25, and 127 may have widths larger than those of conductors 12, 14, 16, and 18. This arrangement reduces a magnetic effect on portions not contributing to the magnetic coupling between coils 20 and 21, thereby increasing the impedance of the coils against the common mode components.

Conductors 12 and 18 may have widths larger than those of conductors 14 and 16, respectively. This arrangement reduces impedance against the differential mode components generated in conductors 12 and 18, accordingly increasing the impedance of coils 20 and 21 against the common mode components.

Then, a method of manufacturing common mode noise filter 101 according to Embodiment 1 shown in FIGS. 1 and 2 will be described below.

First, a predetermined number of rectangular insulating layers 11, 13, 15, 17, and 19 and dummy insulating layers 28A and 28B are prepared from mixture of resin and material powder of magnetic material and nonmagnetic material. Insulating layer 15 is thicker than insulating layers 13 and 17. Holes are formed in insulating layers 13 and 17 by laser, punching, or other methods, and are filled with conductive material, such as silver, providing via-electrodes 23 and 26.

Next, insulating layer 11 is placed on dummy insulating layer 28A. Then, conductor 12 and lead electrode 22 are formed on top surface 11A of insulating layer 11 by plating. Then, insulating layer 13 having via-electrode 23 provided therein is placed on top surface 12C of conductor 12. At this moment, other end 12A of conductor 12 is connected with via-electrode 23. Next, conductor 14 having the spiral shape and lead electrode 24 are formed on top surface 13A of insulating layer 13 by plating. At this moment, other end 14A of conductor 14 is connected with via-electrode 23. Then, insulating layer 15 is placed on top surface 14C of conductor 14. Next, conductor 16 having the spiral shape and lead electrode 25 are formed on top surface 15A of insulating layer 15 by plating. Then, insulating layer 17 having via-electrode 26 provided therein is placed on top surface 16C of conductor 16. At this moment, other end 16A of conductor 16 is connected with via-electrode 26. Next, conductor 18 and lead electrode 27 are formed on top surface 17A of insulating layer 17 by plating. At this moment, other end 18A of conductor 18 is connected with via-electrode 26. Conductors 12, 14, 16, and 18 are formed by providing conductors having predetermined patterns by plating on a base plate (not shown) previously prepared, and by transferring these conductors onto the insulating layers. Next, insulating layer 19 is placed on top surface 18C of conductor 18. Then, dummy insulating layer 28B is placed on top surface 19A of insulating layer 19, thus providing noise filter body 29.

In order to improve production efficiency, plural sets of conductors 12, 14, 16, and 18 may be formed on a large insulating layer wafer, and then, the wafer may be cut to provide plural noise filter bodies 29 at once.

Next, noise filter body 29 is sintered at a predetermined temperature for a predetermined time.

Then, silver is printed on sides 29A and 29B of noise filter body 29, providing external electrodes 30, 31, 32, and 33 connected with lead electrodes 22, 24, 25 and 27, respectively.

Finally, external electrodes 30, 31, 32, and 33 are plated with nickel, providing nickel-plated layers thereon, and further plated with metal, such as tin or solder, providing metal layers having low melting temperatures.

In common mode noise filters 101 to 103 according to Embodiment 1, insulating layer 15 is thicker than insulating layers 13 and 17, preventing insulation failure and migration between conductors 14 and 16, that is, between coils 2 and 3 facing each other across insulating layer 15. Insulating layers 13 and 17 can be thin, thus allowing the distance between insulating layer 11 and conductor 14 and the distance between insulating layer 19 and conductor 16 to be short. This arrangement allows the magnetic field generated in insulating layers 11 and 19 made of magnetic material to be used efficiently, thus allowing coils 20 and 21 to have large impedance against the common mode components.

Figure 5:
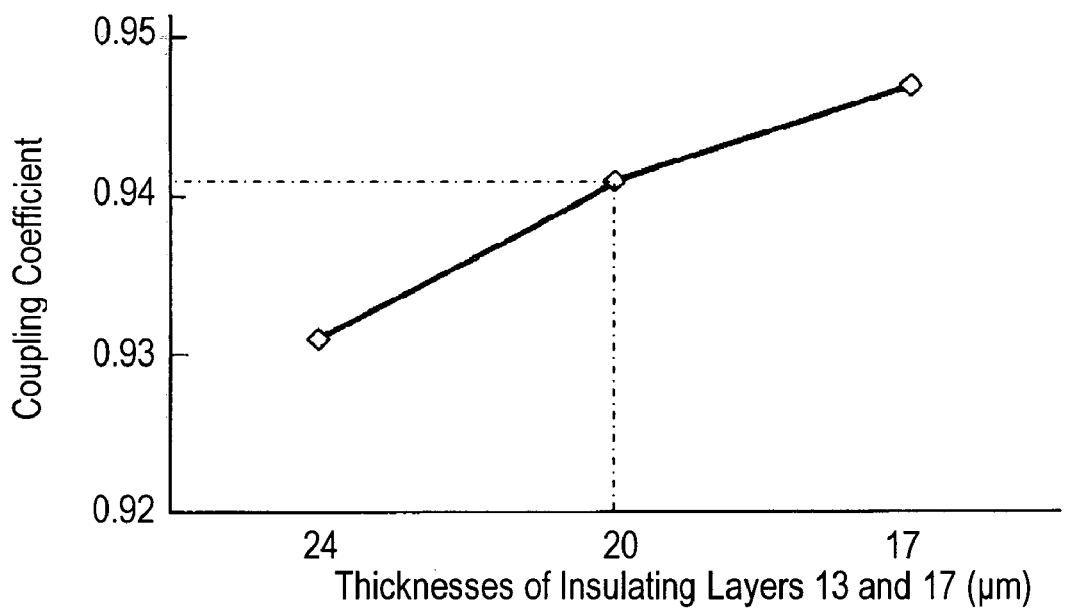
FIG. 5 shows the relation between the thickness of an insulating layer and the coupling coefficient between coils of the common mode noise filter according to Embodiment 1.

FIG. 5 shows the relation between the thicknesses of insulating layers 13 and 15 and the coupling coefficient between coils 20 and 21 of common mode noise filter 101 according to Embodiment 1. Samples of common mode noise filters each having the structure shown in FIG. 1 and each including insulating layer 15 having a thickness of 24 μm were prepared. The larger the coupling coefficient is, the larger the impedance of coils 20 and 21 against the common mode components is. Samples having coupling coefficients not greater than 0.94 are regarded as defectives.

As shown in FIG. 5, in order to obtain a coupling coefficient larger than 0.94, insulating layers 13 and 17 is required to have thicknesses not greater than 20 μm. Insulating layers 13 and 17 having thicknesses exceeding 20 μm can not efficiently use the magnetic field in insulating layers 11 and 19 made of magnetic material.

The minimum thicknesses of insulating layers 13 and 17 may be determined in accordance with required properties, and, for example, may be preferably not less than 5 μm in consideration of handling. Even if insulating layer 13 has a thickness smaller than 20 μm, no insulation failure occurred since conductors 12 and 14 provided on the top surface and the bottom surfaces of insulating layer 13, respectively, have the same potential. Similarly, even if insulating layer 17 has a thickness smaller than 20 μm, no insulation failure occur since conductors 16 and 18 provided on the top surface and the bottom surface of insulating layer 17, respectively, have the same potentials.

Figure 6:
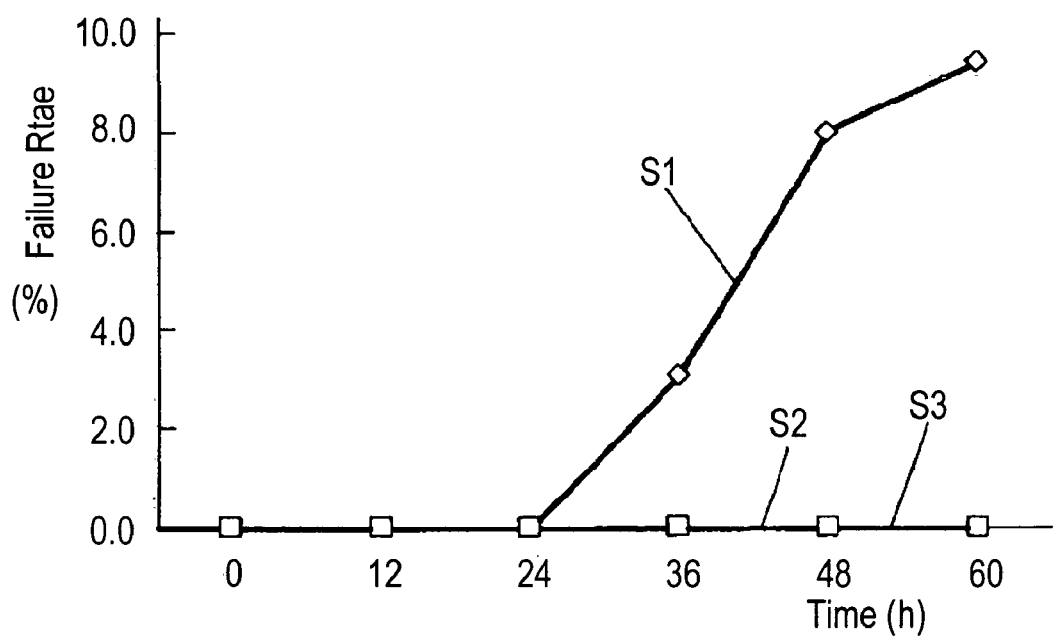
FIG. 6 shows the relation between the thickness of an insulating layer and the rate of insulation failure of the common mode noise filter according to Embodiment 1.

FIG. 6 shows the relation between the thickness of insulating layers 15 and the rate of insulation failure of the common mode noise filter according to Embodiment 1. Samples of the common mode noise filter each having the structure shown in FIG. 1 and each including insulating layers 13 and 17 having thicknesses of 17 μm were prepared. Samples exhibiting insulation resistances between coils 20 and 21 not greater than $10^7 \Omega$ are regarded as defectives while a voltage of 5V is applied continuously between coils 20 and 21 under the conditions of an ambient temperature of 125° C., a humidity of 85%, and a pressure of 2 atm. Samples S1, S2, and S3 include insulating layers 15 having thicknesses of 17 μm, 20 μm, and 24 μm, respectively.

As shown in FIG. 6, insulation failure was observed among sample S1 after 36 hours, but no insulation failure was observed among samples S2 and S3 even after 60 hours. These results indicate that the thickness of insulating layer 15 is preferably not smaller than 20 μm. Insulating layer 15 having a thickness smaller than 20 μm increases the possibility of insulation failure as well as migration between conductors 14 and 16.

The maximum thickness of insulating layer 15 may be determined in accordance with properties required for the filter, and, for example, may be preferably not more than 100 μm in consideration of the magnetic coupling between coils 20 and 21, and the thickness of filter body 29 or other conditions.

Each of common mode noise filters 101 to 103 according to Embodiment 1 includes single coil 20 and single coil 21, however, may include plural coils 20 and plural coils 21 as an array type.

Exemplary Embodiment 2

Figure 7:
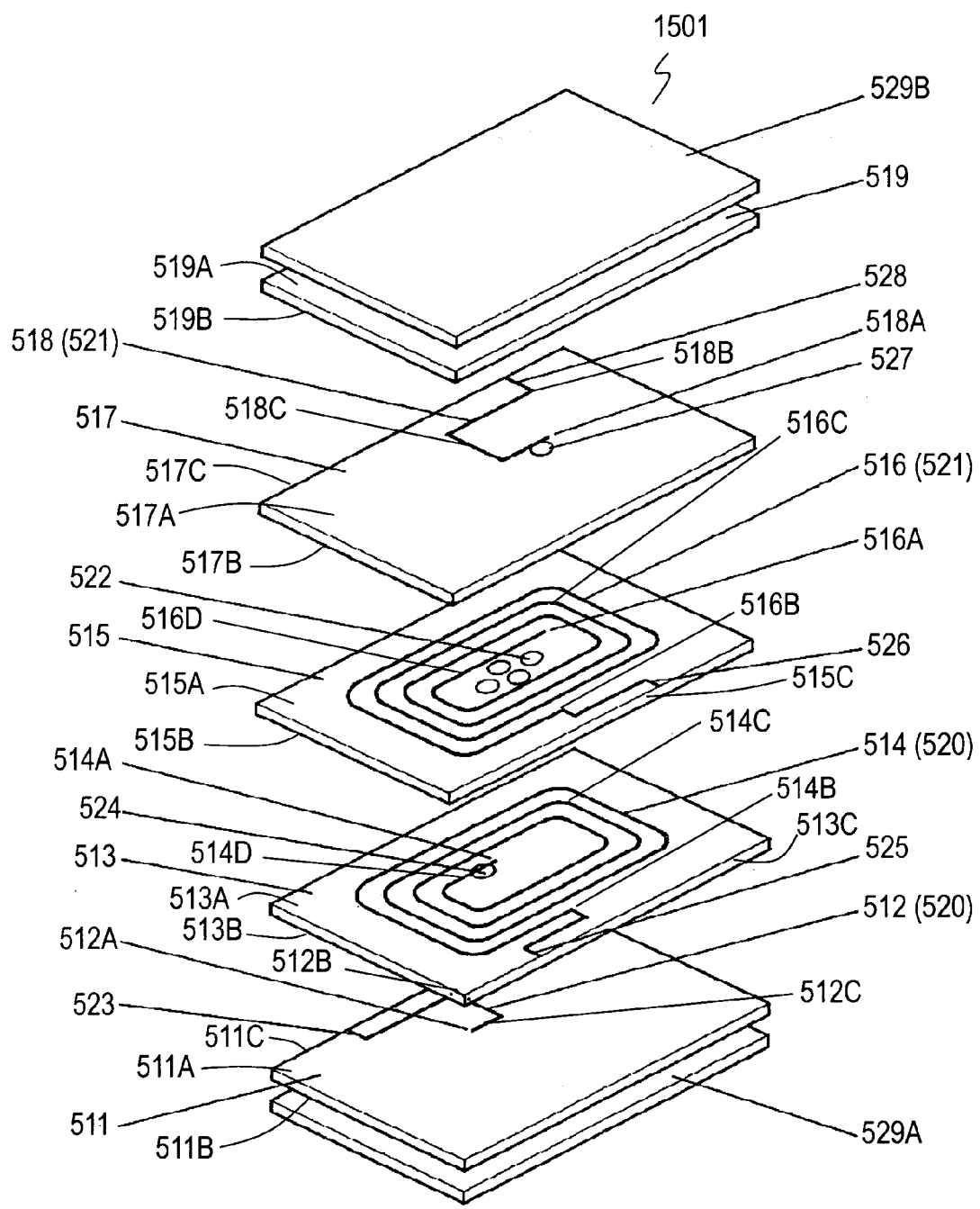
FIG. 7 is an exploded perspective view of a common mode noise filter according to Exemplary Embodiment 2 of the invention.

FIG. 7 is an exploded perspective view of common mode noise filter 1501 according to Exemplary Embodiment 2 of the present invention. Common mode noise filter 1501 includes conductor 512 provided on top surface 511A of insulating layer 511, insulating layer 513 provided on top surface 512C of conductor 512, conductor 514 having a spiral shape provided on top surface 513A of insulating layer 513, insulating layer 515 provided on top surface 514C of conductor 514, conductor 516 having a spiral shape provided on top surface 515A of insulating layer 515, insulating layer 517 provided on top surface 516C of conductor 516, conductor 518 provided on top surface 517A of insulating layer 517, and insulating layer 519 provided on top surface 518C of conductor 518. Conductor 514 is connected with conductor 512, and conductor 518 is connected with conductor 516. More specifically, bottom surface 513B of insulating layer 513 is located on top surface 512C of conductor 512. Bottom surface 515B of insulating layer 515 is located on top surface 514C of conductor 514. Bottom surface 517B of insulating layer 517 is located on top surface 516C of conductor 516. Bottom surface 519B of insulating layer 519 is located on top surface 518C of conductor 518. Conductors 512 and 514 provide coil 520, and conductors 516 and 518 provide coil 521. Insulating layers 511 and 519 are made of magnetic material, and insulating layers 513, 515, and 517 are made of nonmagnetic material. Insulating layer 515 has plural magnetic portions 522 made of magnetic material and inside the spiral shapes of conductors 514 and 516.

Insulating layer 511 is made of magnetic material, such as $Fe_2O_3$-based ferrite, and has a sheet shape, having an insulation property.

Conductor 512 is formed on top surface 511A of insulating layer 511 by plating a conductive material, such as silver. One end 512B of conductor 512 is connected with lead electrode 523 exposing to side 511C of insulating layer 511.

Insulating layer 513 is made of nonmagnetic material, such as Cu—Zn ferrite or glass ceramics, has a sheet shape, has an insulation property, and is placed on top surface 512C of conductor 512. Via-electrode 524 is provided in the center of insulating layer 513 and penetrates from top surface 513A to bottom surface 513B. Via-electrode 524 is connected with other end 512A of conductor 512.

Conductor 514 has the spiral shape on top surface 513A of insulating layer 513, and is formed by plating a conductive material, such as silver. One end 514B of conductor 514 is connected with lead electrode 525 exposing to side 513C of insulating layer 513. Conductor 514A has other end 514A located inside the spiral shape of conductor 514, and other end 514A is connected with via-electrode 524. Via-electrode 524 electrically connects other end 512A of conductor 512 with other end 514A of conductor 514, thus allowing conductors 512 and 514 to provide coil 520.

Insulating layer 515 is made of nonmagnetic material, such as Cu—Zn ferrite or glass ceramics, has a sheet shape, has an insulation property, and is placed on top surface 514C of conductor 514.

Conductors 514 and 516 magnetically affect each other via insulating layer 515, hence causing coils 520 and 521 to be magnetically coupled to each other. This arrangement allows coils 520 and 521 to have large impedance against common mode components of currents flowing through these coils.

Four magnetic portions 522 made of magnetic material are provided at a center area of insulating layer 515 and inside the spiral shapes of conductors 514 and 516. Magnetic portions 522 are formed by putting conductive material, such as $Fe_2O_3$-based ferrite, into holes penetrating insulating layer 515. Magnetic portions 522 are located inside the innermost portions 514D and 516D of conductors 514 and 516 having the spiral shapes, respectively, and contact none of conductors 514 and 516.

The number of magnetic portions 522 is not limited to four, and magnetic portions 522 may not unnecessary penetrate insulating layer 515. Magnetic portions 522 may be made of magnetic material identical to that of insulating layer 511, providing filter 1501 inexpensively. Magnetic portions 522 and via-electrodes 524 and 527 which are made of different materials are provided not on a single insulating layer, thereby being formed easily.

Conductor 516 has the spiral shape on top surface 515A of insulating layer 515 and is formed by plating a conductive material, such as silver. One end 516B of conductor 516 is connected with lead electrode 526 exposing to side 515C of insulating layer 515. Most of conductor 516 faces conductor 514 across insulating layer 515.

Insulating layer 517 is made of nonmagnetic material, such as Cu—Zn ferrite or glass ceramics, has a sheet shape, has an insulation property, and is placed on top surface 516C of conductor 516. Via-electrode 527 is formed at the center of insulating layer 517 and penetrates from top surface 517A to bottom surface 517B of layer 527. Via-electrode 527 is connected with other end 516A of conductor 516. Other end 516A is located inside the spiral shape of conductor 516.

Insulating layer 515 is thicker than insulating layers 513 and 517.

Conductor 518 is formed on top surface 517A of insulating layer 517 by plating a conductive material, such as silver. One end 518B of conductor 518 is connected with lead electrode 528 exposing to side 517C of insulating layer 517. Other end 518A of conductor 518 is located inside the spiral shape of conductor 518 and is connected with via-electrode 527 so as to electrically connect conductor 516 with conductor 518. This arrangement allows conductors 516 and 518 to provide coil 521. Conductors 514 and 516 have the spiral shapes, hence allowing coils 520 and 521 to have large impedance. Via-electrodes 524 and 527 are formed by putting a conductive material, such as silver, into holes penetrating insulating layers 513 and 517, respectively.

Insulating layer 519 is made of magnetic material, such as $Fe_2O_3$-based ferrite, has a sheet shape, has an insulation property, and is placed on top surface 518C of conductor 518.

Insulating layers 513, 515, and 517 may be made of ferrite-based nonmagnetic material. This enables insulating layers 513, 515, and 517 to be sintered together with insulating layers 511 and 519 made of ferrite-based magnetic material, thereby allowing the insulating layers to be bonded securely and stabilizing filter 1501.

Dummy insulating layers 529A and 529B are provided on bottom surface 511B of insulating layer 511 and top surface 519A of insulating layer 519, respectively. Dummy insulating layers 529A and 529B have sheet shapes, have insulation properties, and may be made of either magnetic material or nonmagnetic material. The number of insulating layers 551, 513, 515, 517, and 519 and dummy insulating layers 529A and 529B are not limited to that shown in FIG. 7.

Figure 8:
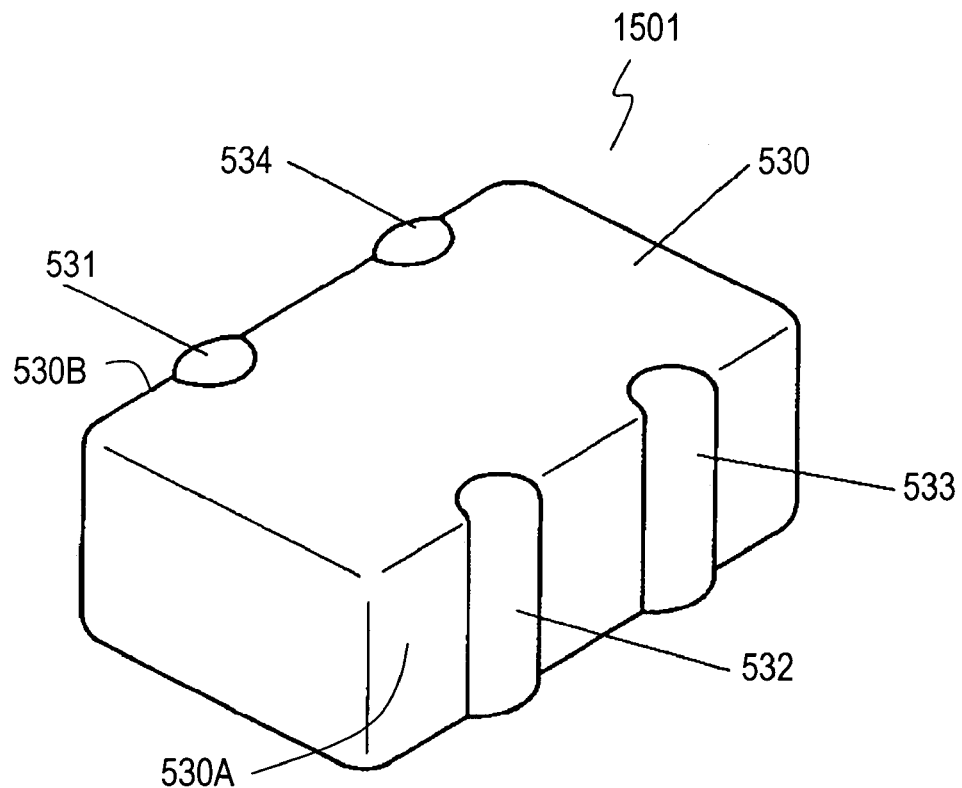
FIG. 8 is a perspective view of the common mode noise filter according to Embodiment 2.

FIG. 8 is a perspective view of common mode noise filter 1501. The aforementioned insulating layers, the conductors, the lead electrodes, and the dummy insulating layers provide noise filter body 530. External electrodes 531, 532, 533, and 534 are provided on sides 530A and 530B of noise filter body 530. External electrodes 531, 532, 533, and 534 are connected with lead electrodes 523, 525, 526, and 528, respectively.

Conductors 514 and 516 magnetically affecting each other have the spiral shapes, hence having respective long portions magnetically affecting each other. This arrangement allows magnetic field between insulating layers 511 and 519 made of magnetic material to be used efficiently, thereby allowing coils 520 and 521 to have large impedance against the common mode components.

The shapes of conductors 512 and 518 are not particularly limited as far as the shapes do not reduce the impedance against the common mode components. As shown in FIG. 7, conductors 512 and 518 have straight shapes, not spiral shapes like conductors 514 and 516. These shapes decrease impedance of the filter against differential components of the currents flowing through coils 520 and 513, and increase the impedance against the common mode components accordingly.

Lead electrodes 523, 525, 526, and 528 may be formed by plating conductive material, such as silver, identical to that of conductors 512, 514, 516, and 518, thus being formed simultaneously to conductors 512, 514, 516, and 518. Conductors 512, 514, 516, and 518 and lead electrodes 523, 525, 526, and 528 may be formed by a method, such as printing or vapor deposition, other than the plating.

Then, a method of manufacturing common mode noise filter 1501 according to Embodiment 2 will be described below.

First, a predetermined number of rectangular insulating layers 511, 513, 515, 517, and 519 and dummy insulating layers 529A and 529B are prepared from a mixture of resin and material powder of magnetic material or nonmagnetic material. Holes are formed in insulating layers 513 and 517 at predetermined positions by laser, punching or other methods, and are filled with silver, providing via-electrodes 524 and 527. Holes are formed in a center area of insulating layer 515, and are filled with magnetic material paste, thus providing magnetic portions 522.

Next, insulating layer 511 is placed on dummy insulating layer 529A. Conductor 512 and lead electrode 523 are formed on top surface 511A of insulating layer 511 by plating. Then, insulating layer 513 having via-electrode 524 provided therein is placed on top surface 512C of conductor 512. At this moment, other end 512A of conductor 512 is connected with via-electrode 524. Next, conductor 514 having the spiral shape and lead electrode 525 are formed on top surface 513A of insulating layer 513 by plating. At this moment, other end 514A of conductor 514 is connected with via-electrode 524. Then, insulating layer 515 having magnetic portions 522 provided therein is placed on top surface 514C of conductor 514. Next, conductor 516 having the spiral shape and lead electrode 526 are formed on top surface 515A of insulating layer 515 by plating. At this moment, magnetic portions 522 are located inside innermost portions 514D and 516D of the spiral shapes of conductors 514 and 516. Then, insulating layer 517 having via-electrode 527 provided therein is placed on top surface 516C of conductor 516. At this moment, other end 516A of conductor 516 is connected with via-electrode 527. Next, conductor 518 and lead electrode 528 are formed on top surface 517A of insulating layer 517 by plating. At this moment, other end 518A of conductor 518 is connected with via-electrode 527.

Conductors 512, 514, 516 and 518 are formed by providing conductors formed by plating in predetermined patterns on a base plate (not shown) prepared previously, and by transferring these conductors onto the insulating layers.

Next, insulating layer 519 is placed on top surface 518C of conductor 518. Then, dummy insulating layer 529B is placed on top surface 519A of insulating layer 519, thus providing noise filter body 530.

In order to improve production efficiency, plural sets of conductors 512, 514, 516, and 518 may be formed on a single insulating layer wafer, and then, the wafer may be cut to provide plural noise filter bodies 530 at once.

Next, noise filter body 530 is sintered at a predetermined temperature for a predetermined time.

Then, silver is printed on sides 530A and 530B of noise filter body 530, thus providing external electrodes 531, 532, 533, and 534 connected with lead electrodes 523, 525, 526, and 528, respectively.

Then, external electrodes 531, 532, 533, and 534 are plated with nickel, thus providing nickel-plated layers thereon, and are then plated with metal, such as tin or solder, thus providing metal layers having low melting temperatures.

Common mode noise filter 1501 according to Embodiment 2 includes plural magnetic portions 522 made of magnetic material provided within a portion of insulating layer 515 inside the spiral shapes of conductors 514 and 516. This arrangement allows the holes for providing magnetic portions 522 to have small diameters, so that the magnetic material paste is not affected so much by surface tension during the putting of the paste in the holes. Consequently, the amount of the magnetic material becomes substantially identical to the volumes of the holes, thus not producing spaces around magnetic portions 522. This effect increases the magnetic field between coils 520 and 521, thereby allowing coils 520 and 521 to have large impedance against the common mode components of the currents flowing through coils 520 and 521. In addition, the spaces are not produced around magnetic portions 522, hence preventing cracks.

Conductors 512, 514, 516, and 518 providing coils 520 and 521 and generating magnetic field are provided on insulating layers 513, 515, and 517 made of nonmagnetic material, hence preventing leakage of magnetic flux. This effect increases the magnetic coupling between coils 520 and 521 and allows coils 520 and 521 to have large impedance against the common mode components.

Magnetic portions 522 made of the magnetic material provided on insulating layer 515 and between coils 520 and 521, i.e., between conductors 514 and 516 magnetically coupling to each other, can increase the magnetic field between coils 520 and 521, thereby increasing the impedance of coils 520 and 521 against the common mode components.

Figure 9:
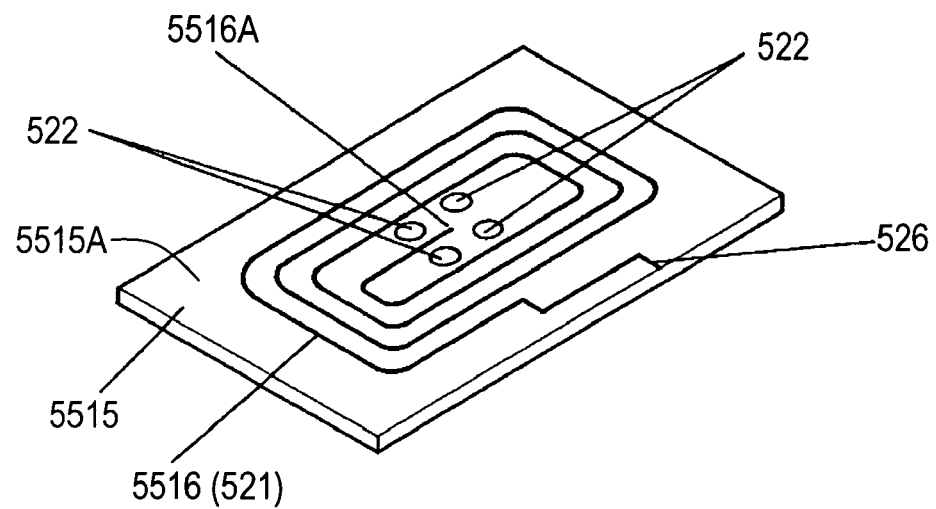
FIG. 9 is a perspective view of an essential part of another common mode noise filter according to Embodiment 2.

FIG. 9 is a perspective view of insulating layer 5515 of another common mode noise filter according to Embodiment 2. This filter includes insulating layer 5515 instead of insulating layer 515 of filter 1501. Conductor 5516 has a spiral shape and has other end 5516A inside the spiral shape of the conductor on top surface 5515A of insulating layer 5515. Other end 5516A is surrounded by plural magnetic portions 522. This arrangement of the magnetic portions 522 allows the inner end of the spiral shape of conductor 5516 to extend, and accordingly, portions of the conductor facing each other across insulating layer 5515 may magnetically affect each other in a large area, increasing the impedance against the common mode components.

Figure 10:
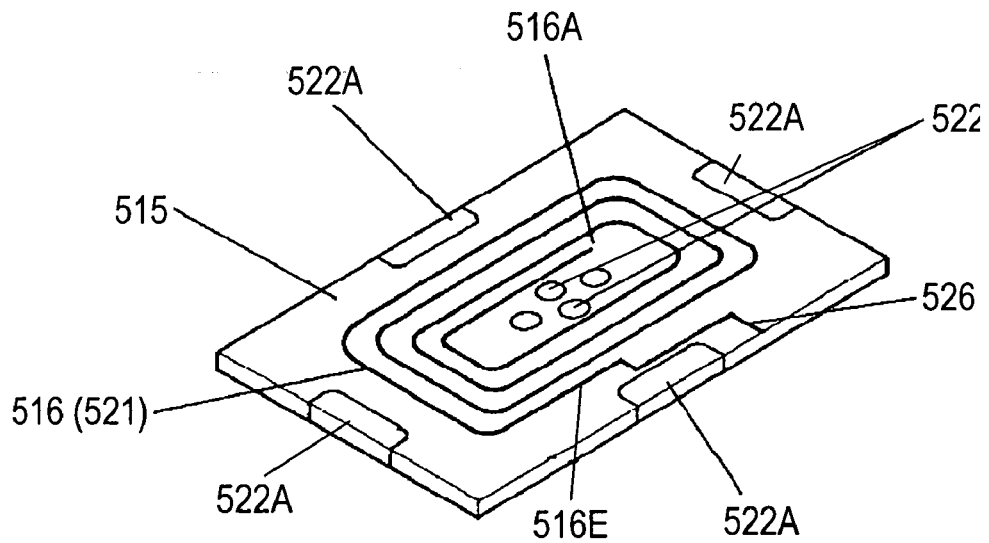
FIG. 10 is a perspective view of an essential part of a further common mode noise filter according to Embodiment 2.

FIG. 10 is a perspective view of insulating layer 515 of a further common mode noise filter according to Embodiment 2. This filter, in addition to magnetic portions 522, includes magnetic portions 522A provided outside the spiral shapes of conductors 514 and 516. Magnetic portions 522A are located outside outermost portion 561E of the spiral shape of conductor 516, that is, at the periphery of insulating layer 515. This arrangement increase the magnetic field between coils 520 and 521 not only at their insides but also at their outsides, thereby further increasing the impedance of the coils against the common mode components. As shown in FIG. 10, magnetic portions 522A are formed on four sides of insulating layer 515 and expose from insulating layer 515. However, magnetic portions 522A may not necessarily provided on all the four sides, or may not necessarily expose from insulating layer 515. Magnetic portions 522A may be formed contiguously to surround conductor 516.

Figure 11:
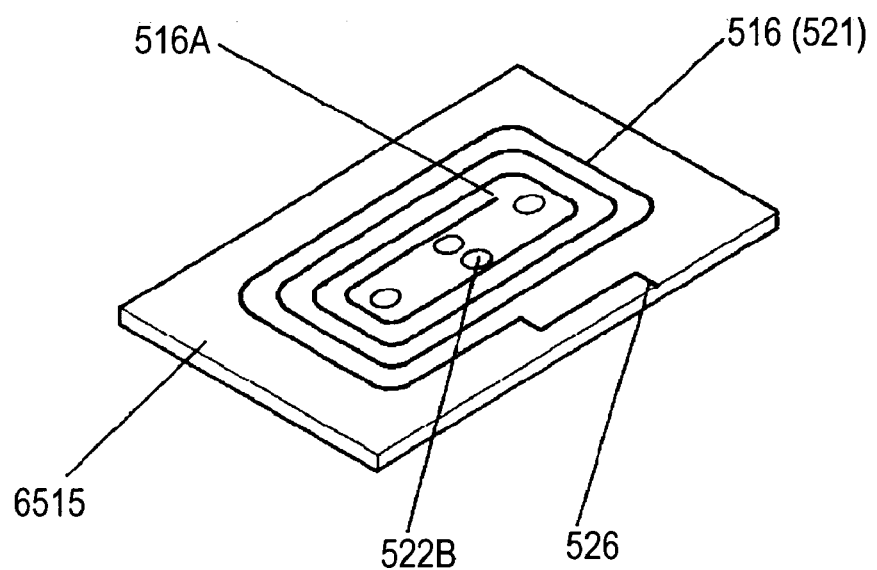
FIG. 11 is a perspective view of an essential part of a still further common mode noise filter according to Embodiment 2.

FIG. 11 is a perspective view of insulating layer 6515 of a still further common mode noise filter according to Embodiment 2. This filter includes insulating layer 6515 instead of insulating layer 515 of filter 1501. Magnetic portions 522B made of insulating magnetic material contact portions of conductors 514 and 516, respectively. This structure allows magnetic portions 522B to have large areas, hence further increasing the impedance against the common mode components.

Figure 12:
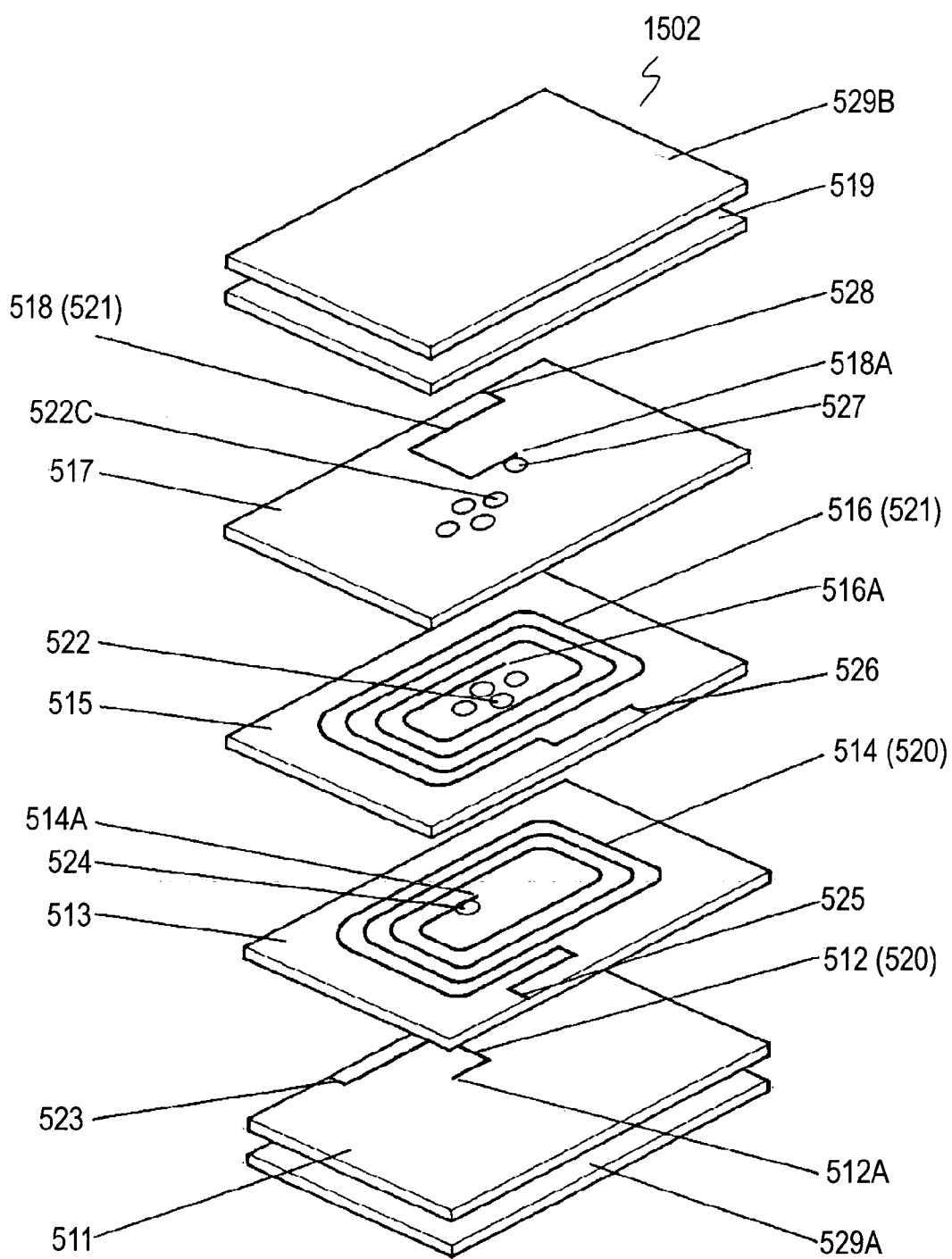
FIG. 12 is an exploded perspective view of a still further common mode noise filter according to Embodiment 2.

FIG. 12 is an exploded perspective view of a still further common mode noise filter 1502 according to Embodiment 2. In filter 1502, magnetic portions 522C are formed on insulating layer 517. Magnetic portions 522C may be either connected or not connected with magnetic portions 522 formed on insulating layer 515. Magnetic portions 522 and 522C further increase the magnetic field between coils 520 and 521, thereby increasing the impedance against the common mode components. Magnetic portions 522C are formed on insulating layer 517 in filter 1502. Another magnetic portion may be formed on insulating layer 513, or other magnetic portions may be formed on both insulating layers 513 and 517, respectively.

Exemplary Embodiment 3

Figure 13:
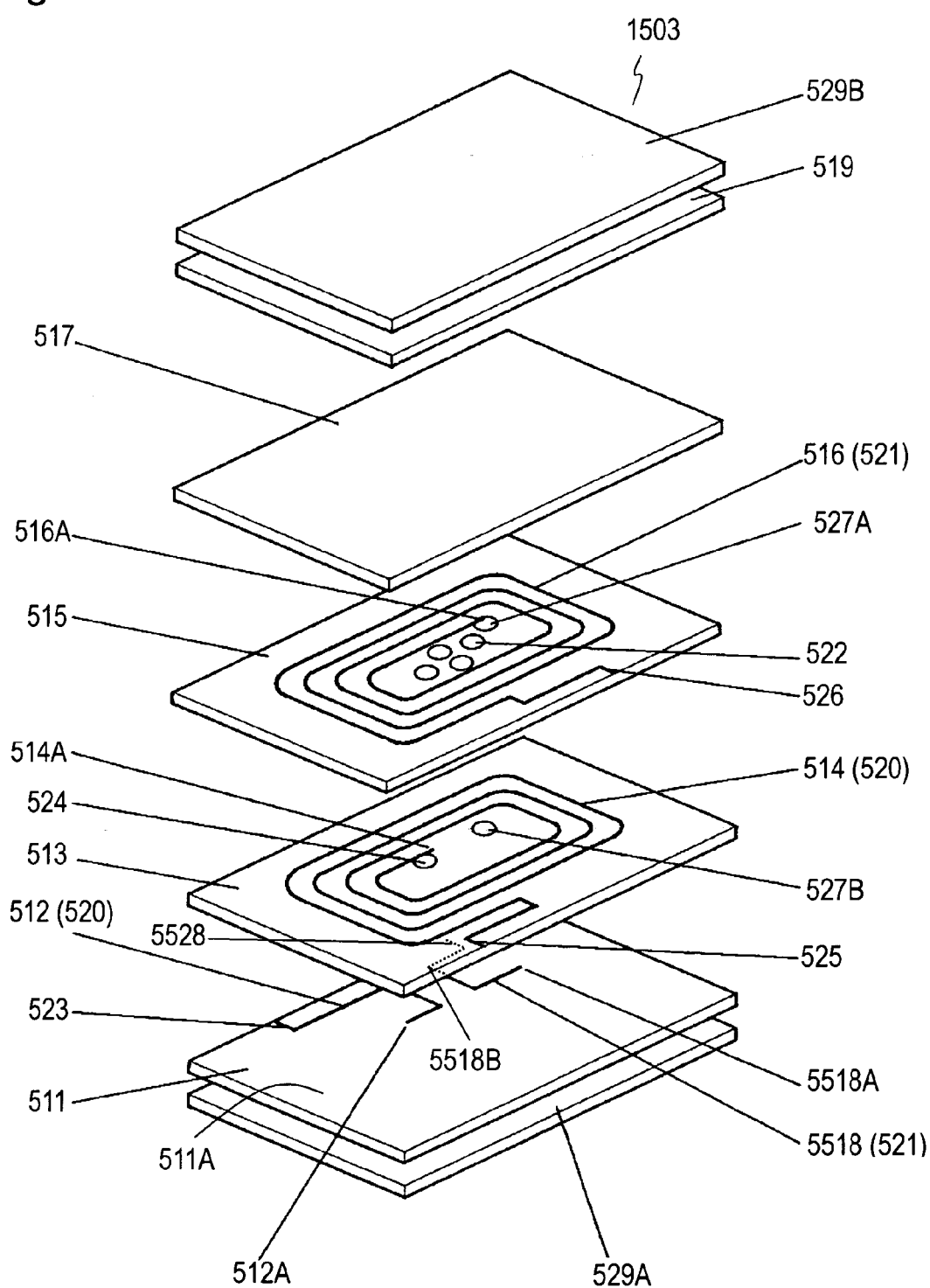
FIG. 13 is an exploded perspective view of a common mode noise filter according to Exemplary Embodiment 3 of the invention.

FIG. 13 is an exploded perspective view of common mode noise filter 1503 according to Exemplary Embodiment 3 of the present invention. The same components as those of Embodiment 2 are denoted by the same reference numerals, and their description will not be provided.

Filter 1503, instead of lead electrode 528 shown in FIG. 7, includes lead electrode 5528 provided on top surface 511A of insulating layer 511 having lead electrode 523 provided on top surface 511A. Via-electrodes 527A and 527B are provided on insulating layers 515 and 513, respectively. Conductor 5518 and lead electrode 5528 are provided on top surface 511A of insulating layer 511. Via-electrodes 527A and 527B connect other end 516A of conductor 516 with conductor 5518. In filter 1502, since lead electrodes 523 and 5528 formed on the same surface, i.e., top surface 511A, lead electrodes 523 and 5528 are magnetically coupled to each other. This arrangement increases a magnetic coupling between coils 520 and 521, increasing impedance of the coils against common mode components.

Lead electrodes 523, 525, 526, and 5528 may have widths larger than those of conductors 512, 514, 516, and 518. This arrangement reduces magnetic effects on portions of conductors 512, 514, 516, and 518 that do not contribute to the magnetic coupling between coils 520 and 521. As a result, only conductors 514 and 516 can be magnetically coupled to each other, hence further increasing the impedance against the common mode components.

Conductors 512 and 5518 may have widths larger than those of conductors 514 and 516. This arrangement reduces impedance of conductors 512 and 518 against differential components of currents flowing through these conductors, thereby increasing the impedance against the common mode components of coils 520 and 521 accordingly.

Exemplary Embodiment 4

Figure 14:
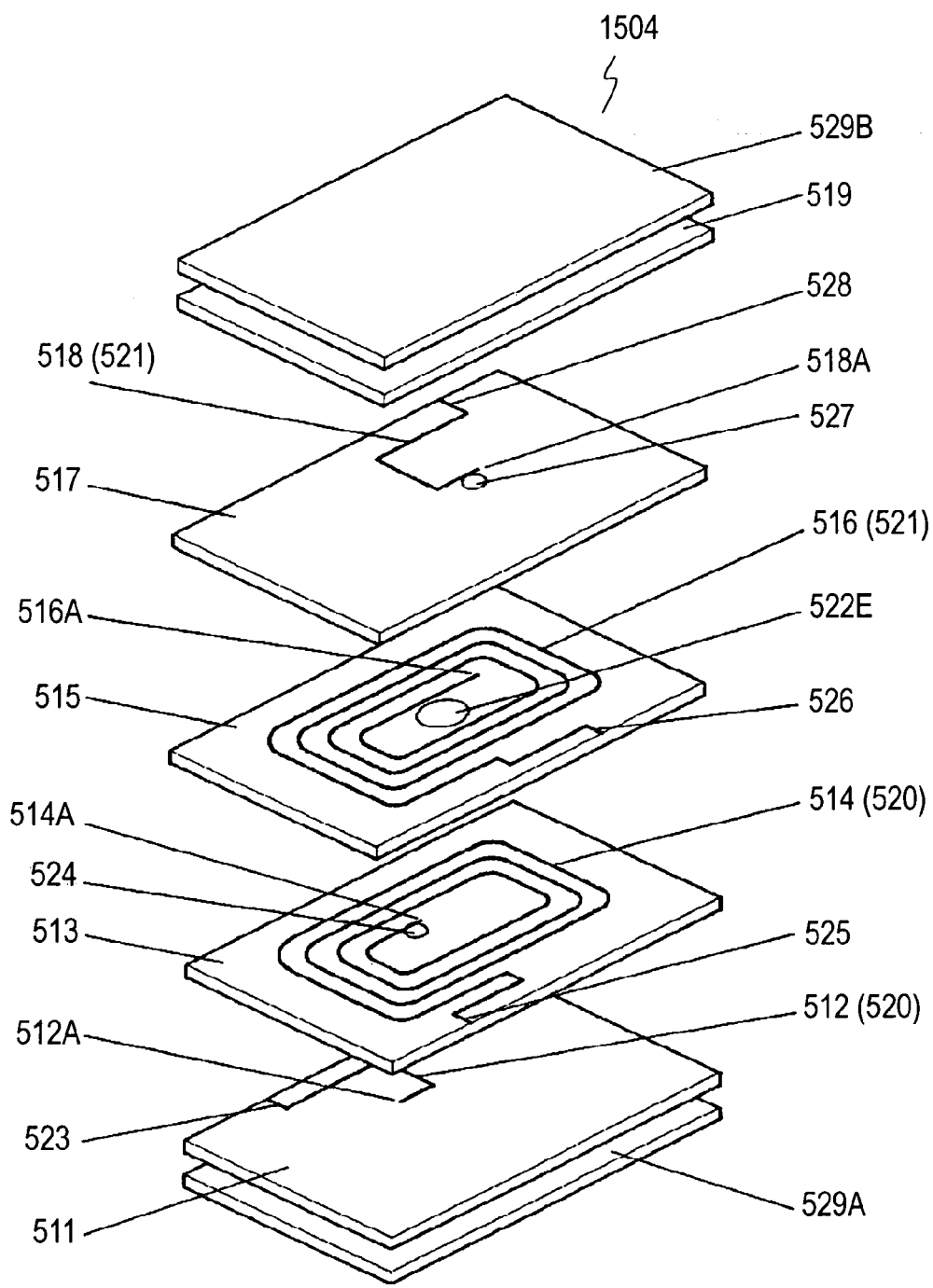
FIG. 14 is an exploded perspective view of a common mode noise filter according to Exemplary Embodiment 4 of the invention.

FIG. 14 is an exploded perspective view of common mode noise filter 1504 according to Exemplary Embodiment 4 of the present invention. The same components as those of Embodiment 2 shown in FIG. 7 are denoted by the same reference numerals, and their description will not be provided.

In filter 1504, insulating layers 513 and 517 have thicknesses not greater than 20 µm. These thicknesses shorten the distance between insulating layers 511 and 514 and the distance between insulating layers 519 and 516. This arrangement allows magnetic field generated in insulating layers 511 and 519 made of magnetic material to be used efficiently, hence allowing coils 520 and 521 to have large impedance against common mode components of currents flowing through the coils. Insulating layer 515 has magnetic portion 522E made of magnetic material. Layer 515 may have plural magnetic portions shown in FIG. 7 instead of magnetic portion 522E.

Figure 15:
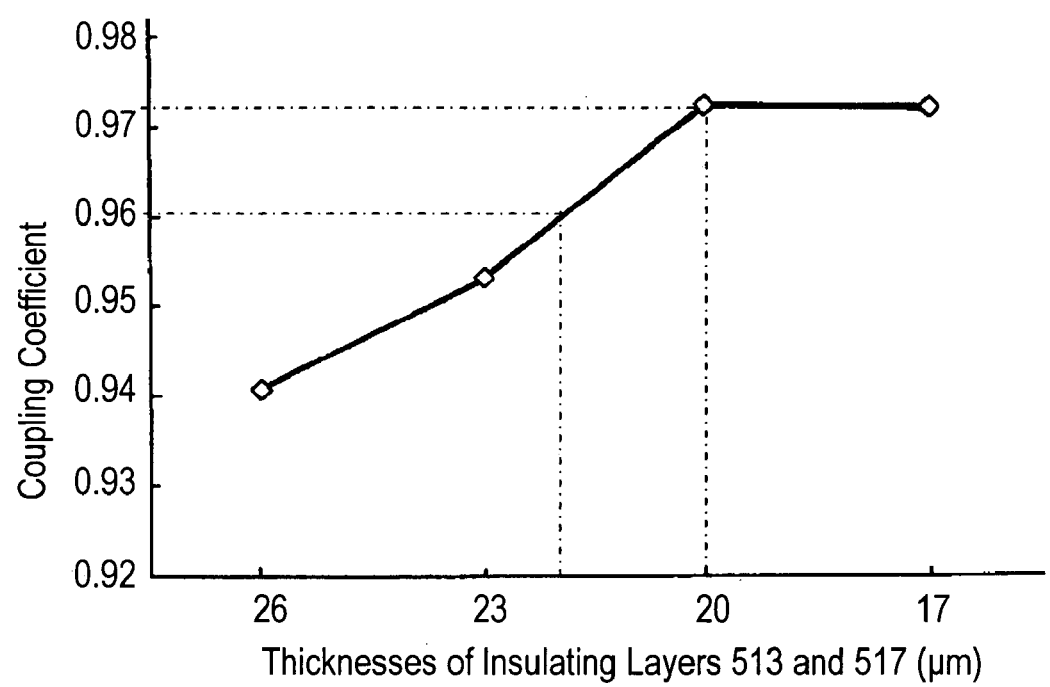
FIG. 15 shows the relation between the thickness of an insulating layer and the coupling coefficient between coils of the common mode noise filter according to Embodiment 4.

FIG. 15 shows the relation of the thicknesses of insulating layers 513 and 517 to the coupling coefficient between coils 520 and 521 of common mode noise filter 1504 according to Embodiment 4. Samples of common mode noise filters each having the structure shown in FIG. 7 and each including insulating layer 515 having a thickness of 26 µm were prepared. The larger the coupling coefficient is, the larger the impedance of coils 520 and 521 against the common mode components is. Samples having coupling coefficients not greater than 0.96 are regarded as defectives.

As shown in FIG. 15, in order to obtain a coupling coefficient larger than 0.96, insulating layers 513 and 517 necessarily have thicknesses not more than 20 µm. Insulating layers 513 and 517 having thicknesses exceeding 20 µm can not efficiently use magnetic field passing through insulating layers 511 and 519 made of magnetic material. The samples including insulating layers 513 and 517 having thicknesses not more than 20 µm exhibit large coupling coefficients even if insulating layer 515 is thick, and the coupling coefficients are substantially identical to those of samples each having insulating layer 515 having a small thickness.

The minimum thickness of insulating layers 513 and 517 may be determined in accordance with required properties, and, for example, is preferably not less than 5 µm in consideration of their handling.

Since insulating layer 515 is thicker than insulating layers 513 and 517, insulating layer 515 can prevent insulation failure or migration between conductors 514 and 516, that is, between coils 520 and 521 facing each other across insulating layer 515. Since insulating layers 513 and 517 can be thin, the distance between insulating layer 511 and conductor 514 and the distance between insulating layer 519 and conductor 516 can be short, hence allowing magnetic field generated in insulating layers 511 and 519 made of magnetic material to be used efficiently. This effect increases the impedance of coils 520 and 521 against the common mode components.

Each of common mode noise filters 1501 to 1504 according to Embodiments 2 to 4 includes single coil 520 and single coil 521, however, may include plural coils 520 and plural coils 521 as an array type.

INDUSTRIAL APPLICABILITY

A common mode noise filter according to the present invention prevents insulation failure and migration between coils and allows the coils to have large impedance against common mode components.

The invention claimed is:

1. A common mode noise filter comprising:
a first insulating layer having a top surface and a bottom surface, the first insulating layer being made of magnetic material;
a first conductor provided on the top surface of the first insulating layer;
a second insulating layer having a top surface and a bottom surface, the bottom surface of the second insulating layer being located on the first conductor, the second insulating layer being made of nonmagnetic material;
a second conductor having a spiral shape provided on the top surface of the second insulating layer, the second conductor having a first end and a second end, the second end of the second conductor being connected with the first conductor, the first conductor and the second conductor providing a first coil;
a third insulating layer having a top surface and a bottom surface, the bottom surface of the third insulating layer being located on the second conductor, the third insulating layer being made of nonmagnetic material;
a third conductor having a spiral shape provided on the top surface of the third insulating layer, the third conductor having a first end and a second end, the third conductor facing the second conductor across the third insulating layer;

a fourth insulating layer having a top surface and a bottom surface, the bottom surface of the fourth insulating layer being located on the third conductor, the fourth insulating layer being made of nonmagnetic material;

a fourth conductor connected with the second end of the third conductor, the third conductor and the fourth conductor providing a second coil;

a fifth insulating layer provided on the fourth conductor, the fifth insulating layer being made of magnetic material;

a first lead electrode connected with the first conductor;

a second lead electrode connected with the first end of the second conductor;

a third lead electrode connected with the first end of the third conductor; and a fourth lead electrode connected with the fourth conductor, wherein the third insulating layer is thicker than the second insulating layer and the fourth insulating layer.

2. The common mode noise filter of claim 1, wherein the fourth conductor is provided on the top surface of the fourth insulating layer.

3. The common mode noise filter of claim 1, wherein the third insulating layer has a thickness not less than 20 μm, and the second insulating layer and the fourth insulating layer have thicknesses not more than 20 μm.

4. The common mode noise filter of claim 1, further comprising a magnetic portion made of magnetic material at the third insulating layer, the magnetic portion being located inside the spiral shape of the second conductor and the spiral shape of the third conductor.

5. The common mode noise filter of claim 1, further comprising a plurality of magnetic portions made of magnetic material at the third insulating layer, the magnetic portions being located inside the spiral shape of the second conductor and the spiral shape of the third conductor.

6. The common mode noise filter of claim 1, wherein the fourth conductor is provided on the top surface of the first insulating layer, wherein the first insulating layer has a side, and wherein the first lead electrode and the fourth lead electrode expose to the side of the first insulating layer.

7. The common mode noise filter of claim 1, wherein the first to fourth lead electrodes have widths larger than widths of the first to fourth conductors.

8. The common mode noise filter of claim 1, wherein the first conductor and the fourth conductor have widths larger than widths of the second conductor and the third conductor.

9. A common mode noise filter comprising:

a first insulating layer having a top surface and a bottom surface, the first insulating layer being made of magnetic material;

a first conductor provided on the top surface of the first insulating layer;

a second insulating layer having a top surface and a bottom surface, the bottom surface of the second insulating layer being located on the first conductor, the second insulating layer being made of nonmagnetic material;

a second conductor having a spiral shape provided on the top surface of the second insulating layer, the second conductor having a first end and a second end, the second end of the second conductor being connected with the first conductor, the first conductor and the second conductor providing a first coil;

a third insulating layer having a top surface and a bottom surface, the bottom surface of the third insulating layer being located on the second conductor, the third insulating layer being made of nonmagnetic material;

a third conductor having a spiral shape provided on the top surface of the third insulating layer, the third conductor having a first end and a second end, the third conductor facing the second conductor across the third insulating layer;

a fourth insulating layer having a top surface and a bottom surface, the bottom surface of the fourth insulating layer being located on the third conductor, the fourth insulating layer being made of nonmagnetic material;

a fourth conductor connected with the second end of the third conductor, the third conductor and the fourth conductor providing a second coil;

a fifth insulating layer provided on the fourth conductor, the fifth insulating layer being made of magnetic material;

a plurality of magnetic portions made of magnetic material provided at the third insulating layer, the plurality of magnetic portions being located inside the spiral shape of the second conductor and the spiral shape of the third conductor;

a first lead electrode connected with the first conductor;

a second lead electrode connected with the first end of the second conductor;

a third lead electrode connected with the first end of the third conductor; and a fourth lead electrode connected with the fourth conductor.

10. The common mode noise filter of claim 9, wherein the fourth conductor is provided on the top surface of the fourth insulating layer.

11. The common mode noise filter of claim 9, wherein the third insulating layer has a thickness not less than 20 μm, and the second insulating layer and the fourth insulating layer have thicknesses not more than 20 μm.

12. The common mode noise filter of claim 9, wherein the fourth conductor is provided on the top surface of the first insulating layer, wherein the first insulating layer has a side, and wherein the first lead electrode and the fourth lead electrode exposed to the side of the first insulating layer.

13. The common mode noise filter of claim 9, wherein the first to fourth lead electrodes have widths larger than widths of the first to fourth conductors.

14. The common mode noise filter of claim 9, wherein the first conductor and the fourth conductor have widths larger than widths of the second conductor and the third conductor.

15. A common mode noise filter comprising:

a first insulating layer having a top surface and a bottom surface, the first insulating layer being made of magnetic material;

a first conductor provided on the top surface of the first insulating layer;

a second insulating layer having a top surface and a bottom surface, the bottom surface of the second insulating layer being located on the first conductor, the second insulating layer being made of nonmagnetic material, the second insulating layer having a thickness not more than 20 μm;

a second conductor having a spiral shape provided on the top surface of the second insulating layer, the second conductor having a first end and a second end, the second end of the second conductor being connected with the first conductor, the first conductor and the second conductor providing a first coil;

a third insulating layer having a top surface and a bottom surface, the second surface of the third insulating layer being located on the second conductor, the third insulating layer being made of nonmagnetic material;

a third conductor having a spiral shape provided on the top surface of the third insulating layer, the third conductor having a first end and a second end, the third conductor facing the second conductor across the third insulating layer;

a fourth insulating layer having a top surface and a bottom surface, the bottom surface of the fourth insulating layer being located on the third conductor, the fourth insulating layer being made of nonmagnetic material, the fourth insulating layer having a thickness not more than 20 μm;

a fourth conductor connected with the second end of the third conductor, the third conductor and the fourth conductor providing a second coil;

a fifth insulating layer provided on the fourth conductor, the fifth insulating layer being made of magnetic material;

a magnetic portion made of magnetic material provided at the third insulating layer, the magnetic portion being located inside the spiral shape of the second conductor and the spiral shape of the third conductor;

a first lead electrode connected with the first conductor;

a second lead electrode connected with the first end of the second conductor;

a third lead electrode connected with the first end of the third conductor; and a fourth lead electrode connected with the fourth conductor.

16. The common mode noise filter of claim 15, wherein the third insulating layer is thicker than the second insulating layer and the fourth insulating layer.

* * * * *